(12) United States Patent
Eslampour

(10) Patent No.: US 7,040,012 B2
(45) Date of Patent: May 9, 2006

(54) METHOD OF ELECTRICALLY AND MECHANICALLY CONNECTING ELECTRONIC DEVICES TO ONE ANOTHER

(75) Inventor: Hamid R. Eslampour, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 10/384,429

(22) Filed: Mar. 7, 2003

(65) Prior Publication Data

US 2004/0173665 A1     Sep. 9, 2004

(51) Int. Cl.
*H05K 3/34*    (2006.01)
(52) U.S. Cl. .............................. 29/840; 29/825; 29/832; 438/15
(58) Field of Classification Search ................ 29/825, 29/832, 840; 228/180.22; 438/16, 15
See application file for complete search history.

(56) References Cited

U.S. PATENT DOCUMENTS

| | | | | |
|---|---|---|---|---|
| 5,427,301 A | * | 6/1995 | Pham et al. ............. | 228/110.1 |
| 5,655,700 A | * | 8/1997 | Pham et al. ............... | 228/106 |
| 5,686,318 A | * | 11/1997 | Farnworth et al. ........... | 438/15 |
| 6,133,638 A | * | 10/2000 | Farnworth et al. .......... | 257/778 |
| 6,326,241 B1 | * | 12/2001 | Belke et al. ............... | 438/118 |
| 6,404,063 B1 | * | 6/2002 | Farnworth et al. .......... | 257/778 |

* cited by examiner

*Primary Examiner*—Carl J. Arbes
(74) *Attorney, Agent, or Firm*—Blakely, Sokoloff, Taylor & Zafman LLP

(57) ABSTRACT

A method is provided for electrically and mechanically connecting a first electronic device to a second electronic device. At least one electric contact of the first device is located against an electric terminal of the second device. The electric contact is tacked to the electric terminal by simultaneously applying heat and pressure between the electric contact and the electric terminal. The electric contact is subsequently diffusion-bonded to the electric terminal by applying heat to the electric contact and the electric terminal for a select period of time while a pressure between the electric contact and the electric terminal is reduced relative to the pressure when tacking the electric contact to the electric terminal.

20 Claims, 2 Drawing Sheets

METHOD OF ELECTRICALLY AND MECHANICALLY CONNECTING ELECTRONIC DEVICES TO ONE ANOTHER

BACKGROUND OF THE INVENTION

1). Field of the Invention

This invention relates to a method of electrically and mechanically connecting a first electronic device to a second electronic device.

2). Discussion of Related Art

Electronic circuits and photonics are often housed in die bodies having electric contacts thereon. The electric contacts are aligned within a few micron on electric terminals of another substrate and then bonded to the substrate. The substrate may have relatively large solder bumps on an opposing side thereof that can be roughly aligned with a motherboard and electrically and mechanically connected thereto.

Various techniques exist for electrically and mechanically connecting devices that are aligned within a few microns of one another, for example, tape-automated bonding (TAB) and controlled collapse chip connect (C4) techniques. TAB bonding requires the creation of a large pressure between an electric contact and an electric terminal in order to create plastic deformation that results in bonding of the electric contacts to the electric terminal. In certain devices, these forces may cause destruction of electronics and photonics of the devices. The same forces are not created in C4 bonding techniques. C4 bonding techniques are basically solder techniques that require the use of solder flux. In certain devices, in particular devices having photonics therein, the use of solder flux may cause undesirable ionization of such photonics.

BRIEF DESCRIPTION OF THE DRAWINGS

The invention is described by way of example with reference to the accompanying drawings, wherein.

DETAILED DESCRIPTION OF THE INVENTION

Description of Devices

Figure 1:
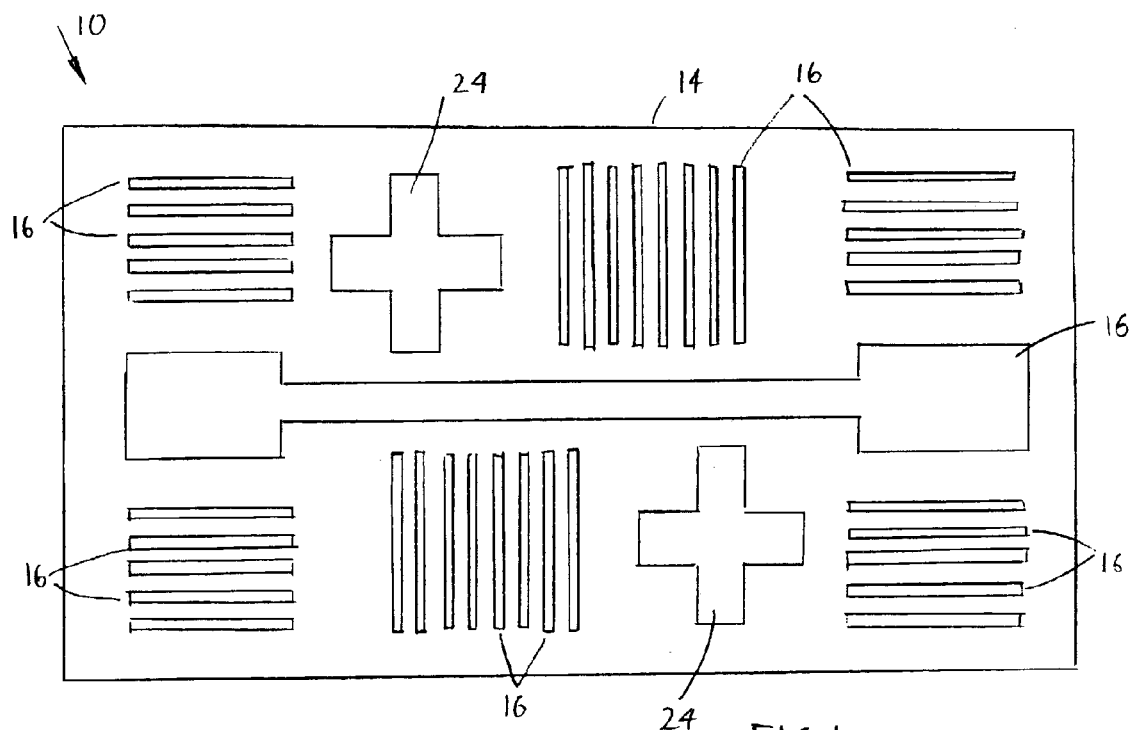
FIG. 1 is a top plan view of a first electronic and photonic device.
Figure 2:
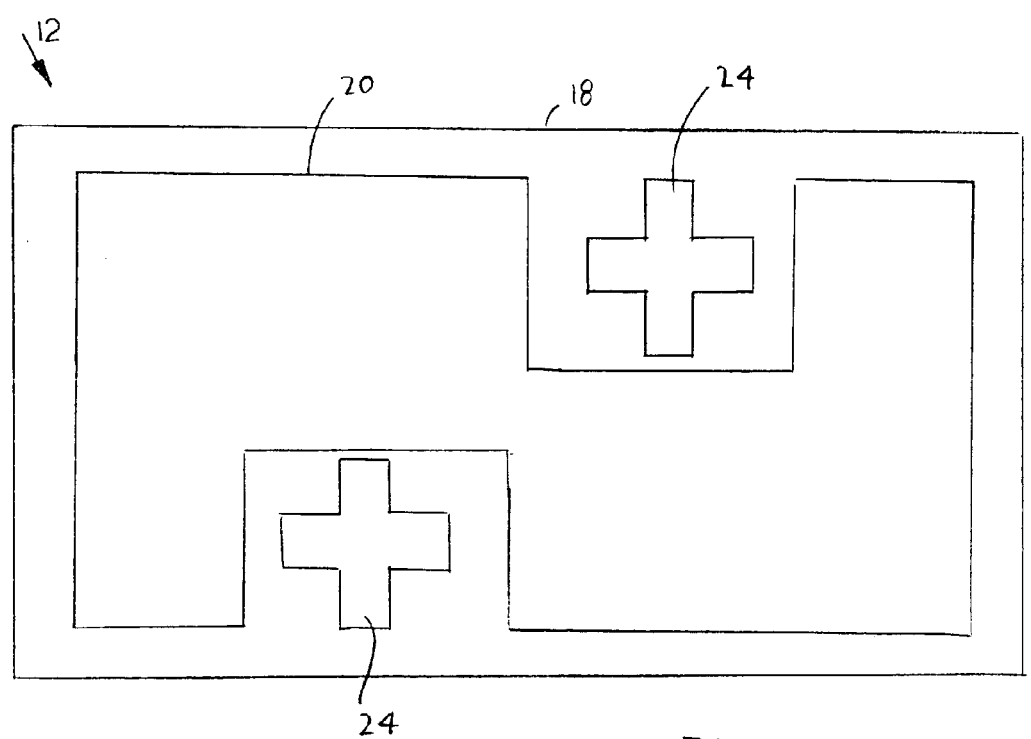
FIG. 2 is a top plan view of a second electronic and photonic device.

FIGS. 1 and 2 illustrate electronic devices 10 and 12, respectively, that are electrically and mechanically connected to one another, according to an embodiment of the invention. The first device 10 has a first die body 14 and electric contacts 16 formed on the die body 14. The second device 12 has a second die body 18 and an electric terminal 20 formed on the second die body 18.

The die bodies 14 and 18 house electronics and photonics that are particularly fragile, especially at high temperature. Functioning of photonics housed by the first and second die bodies 14 and 18 is also extremely sensitive to ionization, for example ionization that might be caused when any components of the devices 10 and 12 are exposed to solder fluxes. A bonding and attachment method is thus preferred that creates the least amount of stresses on the devices 10 and 12, does not expose the devices 10 and 12 to extreme temperatures, and avoids the use of solder fluxes. The first device 10 may, for example, house a laser diode, and the second device may be a photonic logic circuit device.

In use, the device 10 is flipped over and the electric contacts 16 are positioned on the electric terminal 20. Fiducials 24 on the die bodies 14 and 18 are used to align the device 10 relative to the device 12 in a tolerance range of a few microns, typically less than 10 microns. The total surface area of contact between the electric contacts 16 and the electric terminal 20 corresponds to the total surface area taken up by the electric contacts 16 on the first die body 14. The electric contacts 16 are in the form of strips so that the entire surface area taken up by the electric contacts 16 is less than the entire surface area taken up by the electric terminal 20. By laying the electric contacts 16 out in such a manner, the entire surface area of contact can be reduced. A reduction in surface area will result in an increase in pressure between the electric contacts 16 and the electric terminal 20 when a same amount of force is applied by the first electronic device 10 onto the second electronic device 12. The higher pressure may cause easier plastic deformation of the electric contacts 16.

Figure 3:
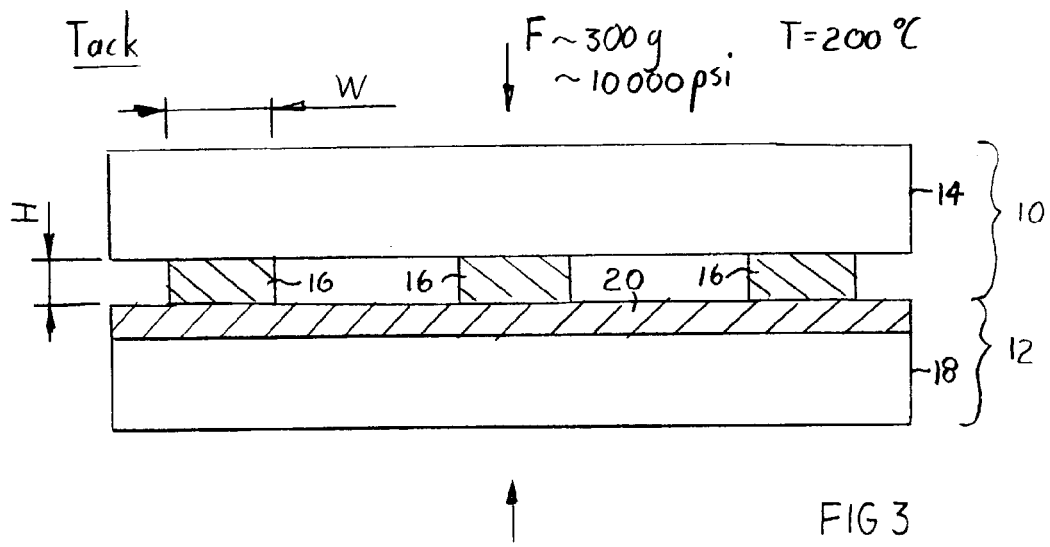
FIG. 3 is a cross-sectional side view illustrating the first device located on the second device and conditions used to tack electric contacts of the first device to an electric terminal of the second device.

FIG. 3 illustrates the first device 10 positioned on the second device 12. Each electric contact 16 has a length extending into the paper, a width W, and a height H. A ratio of the width W to the height H determines when plastic deformation will occur for a given amount of pressure applied between the electric contact 16 and the electric terminal 20. A lower numerical value of the ratio of the width W divided by the height H will cause plastic deformation of the electric contacts 16 at a lower pressure. In general, it is preferred that the ratio of the width W to the height H be less than six, preferably less than five. When the electric contacts 16 are made of gold, a ratio of the width W to the height H of less than five will cause plastic deformation of the electric contacts 16 at a pressure of 10000 psi when the electric contacts 16 are at 200° C. Each electric contact 16 typically has a length of 100 micron, a width W of 5 micron, and a height H of 2 micron.

Tacking

A force corresponding to approximately 300 grams is applied on the first electronic device 10. A total surface area of the electric contacts 16 is approximately 0.04 mm$^2$. The devices 10 and 12 are simultaneously heated to a temperature of 200° C. The contacts 16 are relatively soft and typically have a Vickers hardness number of between 50 and 100.

The combination of the temperature, the pressure, the ratio of the width W to the height H of each electric contact 16, and the material selection causes plastic deformation of the electric contacts 16. The plastic deformation bonds the electric contacts 16 to the electric terminal 20. The electronic device 10 is then electrically and mechanically connected to the electronic device 12 when the pressure is relieved and the temperature reduces to room temperature.

What should be noted is that no flux is used to tack the electric contacts 16 to the electric terminal 20. What should also be noted is that a much lower pressure is required to bond the electric contacts 16 to the electrical terminal 20 than, for example, in TAB techniques, where pressures typically range in the region of approximately 30000 psi. The pressures that are applied are suitably low so as to prevent damage to the electronics and photonics of the devices 10 and 12, and is preferably always below 15000 psi. What should also be noted is that the electric contacts 16 are heated and cooled without ever melting and without ever being exposed to solder flux, as in conventional C4 bonding techniques.

Diffusion Bonding

Figure 4:
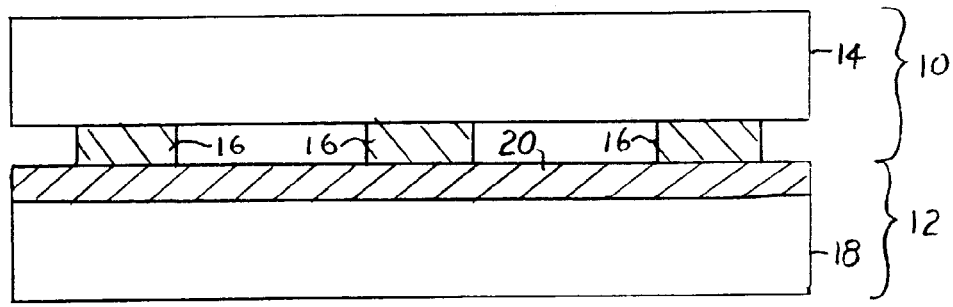
FIG. 4 is a view similar to FIG. 3 illustrating the conditions used to create a diffusion bond between each electric contact and the electric terminal.

Referring to FIG. 4, the package of FIG. 3 is subsequently stored in an oven at approximately 300° C. for approximately one hour. No force is applied while baking the package in the oven. The higher temperature creates a diffusion bond between each electric contact 16 and the electric terminal 20 in order to strengthen the mechanical and electrical interconnection over a period of time. The package is subsequently removed from the oven and allowed to cool to room temperature. The temperature of 300° C. is suitably low to avoid damage to the electronics and especially the photonics and melting of either the gold electric contacts 16 or the electric terminal 20.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of electrically and mechanically connecting a first electronic device to a second electronic device, comprising:
   locating at least one electric contact of the first device against an electric terminal on the second device;
   tacking the electric contact to the electric terminal by simultaneously applying heat to and pressure between the electric contact and the electric terminal; and
   diffusion bonding the electric contact to the electric terminal by applying heat to the electric contact and the electric terminal for a select period of time while a pressure between the electric contact and the electric terminal is reduced relative to the pressure when tacking the electric contact to the electric terminal.

2. The method of claim 1, wherein the electric contact has a width of less than six times a height thereof.

3. The method of claim 1, wherein the electric contact is made of gold.

4. The method of claim 1, wherein a plurality of electric contacts of the first electronic device are located against the electric terminal, the plurality of electric contacts being tacked to the electric terminal and diffusion bonded to the electric terminal.

5. The method of claim 1, wherein the pressure between the electric contact and the electric terminal does not exceed 15000 psi.

6. The method of claim 1, wherein the electric contact and the electric terminal are at less than 300° C. when being tacked to one another.

7. The method of claim 6, wherein the electric contact and the electric terminal are at approximately 200° C. when being tacked to one another.

8. The method of claim 1, wherein the electric contact and the electric terminals are tacked and diffusion bonded to one another without a pressure between the electric contact and electric terminal exceeding 15000 psi without melting the electric contact and without melting the electric terminal.

9. The method of claim 1, wherein a plurality of electric contacts of the first device are located against the electric terminal, each electric contact having a width of less than six times a height thereof, a pressure between each electric contact and the electric terminal not exceeding 15000 psi while tacking the contracts to the electric terminal, the electric contacts being tacked to the electric terminal due to plastic deformation of the electric contacts due to the pressure and heat being applied thereto, without melting either the electric contacts or the electric terminal and without exposing the electric contacts to solder flux.

10. The method of claim 9, wherein at least one of the devices is a photonic device.

11. A method of electrically and mechanically connecting a first electronic device to a second electronic device, comprising:
    locating multiple electric contacts of the first device on a single electric terminal of the second electronic device; and
    simultaneously applying heat to and pressure between each electric contact and the electric terminal to create a bond between the electric contacts and the electric terminal without melting either the electric contacts or the electric terminal.

12. The method of claim 11, wherein each electric contact has a width of less than six times a height thereof.

13. The method of claim 12, wherein a pressure between each electric contact and the electric terminal does not exceed 15000 psi.

14. The method of claim 11, wherein the electric contacts are tacked to the electric terminal due to plastic deformation of the electric contacts due to the pressure and heat being applied thereto, without melting either the electric contacts or the electric terminal and without exposing the electric contacts to solder flux.

15. A method of electrically and mechanically connecting a first electronic device to a second electronic device, comprising:
    locating at least one electric contact of the first device against an electric terminal of the second device, the electric contact having a width of less than six times a height thereof;
    creating a pressure between the electric contact and the electric terminal; and
    applying heat to the electric contact and the electric terminal, while the pressure is applied, to a temperature that creates a bond between the electric contact and the electric terminal without melting the electric contact or the electric terminal.

16. The method of claim 15, wherein the pressure between the electric contact and the electric terminal does not exceed 15000 psi.

17. The method of claim 16, wherein a plurality of electric contacts of the first device are located against the electric terminal, each electric contact having a width of less than six times a height thereof, a pressure between each electric contact and the electric terminal not exceeding 15000 psi while tacking the contracts to the electric terminal, the electric contacts being tacked to the electric terminal due to plastic deformation of the electric contacts due to the pressure and heat being applied thereto, without melting either the electric contacts or the electric terminal and without exposing the electric contacts to solder flux.

18. A method of electrically and mechanically connecting a first electronic device to a second electronic device, comprising:
    locating multiple electric contacts of the first device on a single electric terminal of the second electronic device, each electric contact having a width of less than six time a height thereof;
    simultaneously applying heat to and pressure not exceeding 15000 psi between each electric contact and the electric terminal to create a bond between the electric contacts and the electric terminal without melting either the electric contacts or the electric terminal and without exposing the electric contacts to solder flux; and applying heat to the electric contact and the electric terminal for a select period of time while a pressure between the electric contact and the electric terminal is reduced relative to the pressure when tacking the electric contact to the electric terminal.

19. The method of claim 18, wherein each electric contact has a Vickers hardness number of between 50 and 100.

20. The method of claim 18, wherein the electric contacts are in the form of strips.

\* \* \* \* \*